(12) United States Patent
Klipp et al.

(10) Patent No.: US 9,891,520 B2
(45) Date of Patent: Feb. 13, 2018

(54) USE OF SURFACTANTS HAVING AT LEAST THREE SHORT-CHAIN PERFLUORINATED GROUPS IN FORMULATIONS FOR PHOTO MASK CLEANING

(71) Applicant: BASF SE, Ludwigshafen (DE)

(72) Inventors: Andreas Klipp, Lambsheim (DE); Andrei Honciuc, Wädenswil (CH); Chu-Ya Yang, Zhongli (TW)

(73) Assignee: BASF SE, Ludwigshafen am Rhein (DE)

( * ) Notice: Subject to any disclaimer, the term of this patent is extended or adjusted under 35 U.S.C. 154(b) by 74 days.

(21) Appl. No.: 14/904,018

(22) PCT Filed: Jul. 8, 2014

(86) PCT No.: PCT/IB2014/062938
§ 371 (c)(1),
(2) Date: Jan. 8, 2016

(87) PCT Pub. No.: WO2015/004596
PCT Pub. Date: Jan. 15, 2015

(65) Prior Publication Data
US 2016/0161846 A1    Jun. 9, 2016

(30) Foreign Application Priority Data

Jul. 11, 2013   (EP) .................................... 13176102

(51) Int. Cl.
| | |
|---|---|
| G03F 1/82 | (2012.01) |
| G03F 1/68 | (2012.01) |
| G03F 1/24 | (2012.01) |
| G03F 7/20 | (2006.01) |
| G03F 7/32 | (2006.01) |
| C11D 1/00 | (2006.01) |
| G03F 1/22 | (2012.01) |

(52) U.S. Cl.
CPC ................ *G03F 1/82* (2013.01); *C11D 1/004* (2013.01); *G03F 1/24* (2013.01); *G03F 1/68* (2013.01); *G03F 7/20* (2013.01); *G03F 7/32* (2013.01); *G03F 1/22* (2013.01)

(58) Field of Classification Search
CPC ..... G03F 1/24; G03F 1/68; G03F 1/82; G03F 7/20; G03F 7/32; C11D 1/004
USPC ...................................................... 430/5, 331
See application file for complete search history.

(56) References Cited

U.S. PATENT DOCUMENTS

| | | | |
|---|---|---|---|
| 2008/0299487 | A1 | 12/2008 | Chang |
| 2009/0264525 | A1 | 10/2009 | Hierse et al. |
| 2012/0276474 | A1 | 11/2012 | Yamauchi et al. |

FOREIGN PATENT DOCUMENTS

| | | |
|---|---|---|
| EP | 2479616 A1 | 7/2012 |
| WO | 008003445 A1 | 1/2008 |
| WO | 2008003443 A1 | 1/2008 |
| WO | 2008003446 A2 | 1/2008 |
| WO | 2009014980 | 1/2009 |
| WO | 2009149807 A1 | 12/2009 |
| WO | 20120101545 A1 | 8/2012 |

OTHER PUBLICATIONS

Brian J. Grenon: "Challenges associated with advanced mask cleaning" in Proceedings of SPIE, Oct. 6, 2011; p. 81661K, vol. 8166. ISSN: 0277-786X.
International Search Report for Application No. PCT/IB2014/062938 dated Dec. 23, 2014, 2 pgs.
European Search Report for Application No. EP13176102 completed Nov. 19, 2013, 2 pgs.
User Manual of the MobileDrop™ Contact Angle Measuring Instrument. KROSS GmbH, 2006.

*Primary Examiner* — Christopher G Young
(74) *Attorney, Agent, or Firm* — Armstrong Teasdale LLP

(57) ABSTRACT

In a method for cleaning photo masks having patterns with smallest line-space dimensions below 200 nm, a surfactant composition A is used, wherein A contains at least three short-chain perfluorinated groups Rf selected from the group consisting of trifluoromethyl, pentafluoroethyl, 1-heptafluoropropyl, 2-heptafluoropropyl, and pentafluorosulfanyl and wherein A exhibits, at a 1% by weight aqueous solution, a static surface tension below 25 mN/m.

18 Claims, No Drawings

USE OF SURFACTANTS HAVING AT LEAST THREE SHORT-CHAIN PERFLUORINATED GROUPS IN FORMULATIONS FOR PHOTO MASK CLEANING

The present invention relates to the use of surfactants having at least three short-chain perfluorinated groups Rf for cleaning photo masks having patterns for manufacturing semiconductor substrates comprising patterns with smallest line-space dimensions of 60 nm and below.

BACKGROUND OF THE INVENTION

In the process of manufacturing ICs with LSI, VLSI and ULSI, patterned material layers are produced by photolithographic techniques. Nowadays, such patterned material layers comprise structures of dimensions even below 20 nm with high aspect ratios.

Photolithography is a method in which a pattern on a photo mask is projected onto a substrate such as a semiconductor wafer. Semiconductor photolithography typically includes the step of applying a layer of a photoresist on a top surface of the semiconductor substrate and exposing the photoresist to actinic radiation, in particular UV radiation of a wavelength of, for example, 193 nm or 13.5 nm, by using a transmission or reflective photo mask.

As technologies advance and dimension requirements become stricter and stricter, photoresist patterns are required to include relatively thin and tall structures or features of photoresists, i.e., features having a high aspect ratio, on the substrate. With the shrinking of the dimensions of the structures on the substrate itself also the dimensions of the photo mask need to shrink.

The current cleaning processes ($O_3$, SC1 & ultra pure water for 28 nm) do also not provide mask surfaces that are free from contamination (Haze defect generation).

WO 2012/101545 A discloses the use of surfactants having at least three short-chain perfluorinated groups Rf for manufacturing integrated circuits (ICs), in particular, ICs having large-scale integration (LSI), very-large-scale integration (VLSI) and ultra-large-scale integration (ULSI), the said ICs having high aspect ratio patterns with line-space dimensions below 50 nm.

As semiconductor manufacturing advances to sub-20 nm node (i.e., minimum feature pitch) technology, specifications with respect to 'dust' on photo masks are becoming even more stringent. As a rule of thumb the photo mask patterns of transparent photo masks, like that for 193 nm immersion lithography, need to be about 4 to 5 times bigger than the minimum feature size to be printed on the micro device wafer. This means that for a 20 nm feature to be printed on the device wafer, the minimum feature size of the photomask has to be 80 to 100 nm while keeping a high aspect ratio above 1.

Photo mask cleanliness is essential to high-quality lithography. Detecting a single newly introduced particle following pellicle (protective cover) mounting may result in a loss of one to two days for demounting, repairing, and cleaning of the photo mask as well as yield loss (as defects will be transferred during the exposure process to the wafer). A major challenge in developing sub-20 nm node mask cleaning processes is therefore the removal of extremely fine particles (<50 nm) from the photo mask surface.

New photo mask cleaning processes are required to remove and eliminate particles on photo masks and to remove contaminants that can cause defect formations. Typical cleaning processes work by under-etching the particle which stays on the surface, i.e. by under-etching the particle is removed from the surface. The under-etching needs to be as low as possible in order to reduce the attack of the substrate surface to avoid Critical Dimension (CD) loss and increase of surface roughness.

It is therefore an object of the present invention to provide a further use for fluorosurfactants containing at least three short-chain perfluorinated groups Rf and/or pentafluorosulfanyl groups.

It is a further object of the present invention to provide a process for preparing photo masks without causing damage of the patterned photo masks.

It is yet another object of the present invention to provide an improved photolithographic process which allows for the photolithography of photoresist layers with reduced defects.

SUMMARY OF THE INVENTION

It was surprisingly found that cleaning solutions comprising surfactants A are useful for cleaning molybdenum and silicon containing layers of transmission-type and reflective-type photo masks.

Accordingly, the new use of surfactants A for cleaning photo masks comprising patterns with smallest line-space dimensions below 200 nm has been found, a 1% by weight aqueous solutions of the said surfactants having a static surface tension below 25 mN/m and the said surfactants A containing at least three short-chain perfluorinated groups Rf selected from the group consisting of trifluoromethyl, pentafluoroethyl, 1-heptafluoropropyl, 2-heptafluoropropyl, heptafluoroisopropyl, and pentafluorosulfanyl.

Hereinafter, such use of the surfactants A is referred to as the "use according to the invention".

Moreover, an improved photo mask manufacturing process has been found, the said process comprising the steps of (1) providing a photo mask carrier,
(2) depositing absorbing or reflective layer(s) comprising molybdenum and silicon on the carrier,
(2a) if applicable, depositing a non-reflecting layer on the reflective layer(s),
(3) structuring the absorbing or non-reflecting layer to obtain a photo mask comprising pattern having smallest line-space dimensions of 200 nm and below,
(4) cleaning the photo mask with a solution comprising at least one surfactant A, a 1% by weight aqueous solution of which exhibiting a static surface tension below 25 mN/m, the said surfactant A containing at least three short-chain perfluorinated groups Rf selected from the group consisting of trifluoromethyl, pentafluoroethyl, 1-heptafluoropropyl, 2-heptafluoropropyl, and pentafluorosulfanyl groups is performed.

A further embodiment of the present invention is an improved photolithographic process, the said process comprising the steps of
(1) repeatedly performing the steps (a) to (c) for a selected number of times
  (a) providing a substrate having a photoresist layer;
  (b) exposing the photoresist layer to actinic radiation by using a transmission- or reflective-type photo mask;
  (c) developing the exposed photoresist layer with a developer solution in order to receive patterns having smallest line-space dimensions of 60 nm and below; and
(2) contacting the photo mask with a cleaning solution comprising at least one surfactant A, a 1% by weight aqueous solution of which exhibits a static surface tension below 25 mN/m, the said surfactant A containing at least three short-chain perfluorinated groups Rf selected from the group consisting of trifluoromethyl, pentafluoroethyl, 1-heptafluoropropyl, 2-heptafluoropropyl, and pentafluorosulfanyl groups for a time sufficient to remove at least part of the particles deposited onto the photo mask during step (1).

It was particularly surprising that a cleaning solution useful for cleaning of photoresist layers, developing photoresist layers or chemical rinse of patterned developed photoresist layers could also be used for cleaning photo masks useful for manufacturing semiconductor substrates comprising patterns having line-space dimensions below 60 nm. The use according to the invention allowed for a significant reduction of defects in the preparation process of the photo masks itself as well as a significant defect reduction in the photoresist patterns by using an additional cleaning step in order to remove particles and other contaminations from the photo masks during the IC manufacturing process.

The cleaning solution comprising surfactants A according to the present invention offers
(1) a broader process window for megasonic treatment;
(2) a better particle removal efficiency;
(3) no haze formation;
(4) no Critical Dimension (CD) loss; the photo masks are not attacked by the cleaning chemistry and there is no increase of roughness; and
(5) superior wetting of the surface of the photo mask.

DETAILED DESCRIPTION OF THE INVENTION

In its broadest aspect, the present invention is useful in cleaning photo masks for the manufacturing of ICs, in particular ICs with LSI, VLSI and/or ULSI, the said photo masks comprising patterns for manufacturing semiconductor substrates comprising features having line-space dimensions below 60 nm.

With respect to the dimensions of the corresponding photo mask patterns to be cleaned this means that the present invention is directed to the use of the selected surfactants A in cleaning photo masks comprising patterns comprising features having line-space dimensions below 200 nm, preferably below 150 nm, even more preferably below 100 nm, most preferably below 80 nm, i.e. photo mask patterns for manufacturing the sub-20 nm technology nodes.

Line-space dimensions as used herein means the half-pitch size (i.e., half the distance between identical features in an array). Besides the features below 60 nm on the semiconductor substrate (corresponding to 200 nm in the photo mask) also bigger sized features may be present (and are usually present).

Preferably, the cleaning solutions are useful for cleaning photo mask having patterns for manufacturing semiconductor substrates comprising patterns with smallest line-space dimensions of 40 nm and below, more preferably line-space dimensions of 30 nm and below, even more preferably line-space dimensions of 25 nm and below, most preferably line-space dimensions of 20 nm and below.

In particular, the cleaning solutions comprising surfactants A may either be used for cleaning photo masks during the manufacturing of such photo masks or for cleaning the photo masks during the IC manufacturing process.

The following types of lithography photo masks are presently used for preparing such line-space dimensions and aspect ratios, both comprising molybdenum and silicon layers:

(a) Photo masks used in 193 nm ArF lithography (and earlier generations) are transparent and known as transmission-type photo masks using an opaque molybdenum (Mo) silicon (Si) on glass (OMOG) photo mask. In this case OMOG photo mask blanks are made by depositing alternating Mo/Si layers onto an appropriate substrate transparent for the 193 nm radiation, such as but not limited to synthetic quartz substrates. Afterwards a thin chrome film is deposited on top of these layers. The Mo/Si layers and the chrome layer absorb ArF-emitted light, but when these layers are removed from an area of the substrate, light passes through that area. This method allows a lower patterning aspect ratio than standard phase shift masks and it is better suited to finer design nodes. This type of lithography may be used with or without an immersion liquid.

(b) EUVL masks are generally made with multiple alternating layers of molybdenum (Mo) and silicon (Si) and known as reflective-type masks.

Since the wavelength of EUV light is 13.5 nm it is absorbed by nearly all substances and EUV masks thus use reflective material. These masks are made by depositing up to 80 alternating layers of reflective Mo and Si (40 layers each) on a glass substrate. On top of the reflective Mo/Si layers buffer and absorber layer(s) are deposited and patterned. The absorber layers usually comprise nitrogenized tantalum boride-based materials (TaBN). The buffer layer is usually made of $SiO_2$. EUV light striking the alternating Mo/Si layers is reflected and EUV light striking the absorbing layer is absorbed.

The light source output is a major issue for EUVL processing. It is essential to maximize the EUV light to reach the wafer with as little attenuation as possible to increase the ratio of light reflected by the Mo/Si layers (reflection factor). The more alternating Mo/Si layers used, the higher the reflection factor becomes. However, more layers also result in lower yields and, after a certain number of layers, diminishing returns are seen in terms of improved reflection factor. Current practice is to use a layer set with about 65% reflectivity, which requires the 40 paired Mo/Si layers described above (although the theoretical upper limit is a reflection factor of about 70% using this method).

If a stepper system uses six mirrors, the light from the light source has to be reflected seven times (including the reflection from the photo mask) before reaching the surface of a target wafer; with reflection factor of 70%, only 8% ($0.7^7$) of the output from the light source reaches the wafer.

It has to be emphasized that both types of photo masks comprise molybdenum and silicon layers, which makes them chemically similar.

The photo mask preparation process according to the present invention comprises the steps of
(1) providing a photo mask carrier,
(2) depositing absorbing or reflective layer(s) comprising molybdenum and silicon on the carrier,
(2a) if applicable, depositing an absorbing layer on the reflective layer(s),
(3) structuring the absorbing or non-reflecting layer to obtain a photo mask with smallest line-space dimensions of 200 nm and below, preferably 100 nm and below and most preferably 80 nm and below,
(4) cleaning the photo mask with a solution comprising at least one surfactant A as described herein.

In case of a reflective-type photo mask, step (2a) need to be performed since the absorbing layer or absorber needs to be patterned, whereas in case of a transmission-type photo mask step (2a) can be omitted since the absorbing layer deposited in step (2) is patterned.

The cleaning solutions may also advantageously be used for finally cleaning the photo mask after its preparation as described above.

Alternatively, the cleaning solutions may be used before, during and/or after the IC manufacturing process itself. In this case, after a photo mask has been used within a selected number of photolithographic cycles a cleaning step is performed to remove particles or other contamination, without generating haze defects or without generating CD loss due to attack of photo mask pattern.

In one embodiment of the present invention a photolithographic process is provided, the process comprising the steps of (1) repeatedly performing the steps (a) to (c) for a selected number of times
  (a) providing a substrate having a photoresist layer;
  (b) exposing the photoresist layer to actinic radiation by using a transmission or reflective photo mask;
  (c) developing the exposed photoresist layer with a developer solution in order to receive patterns having smallest line-space dimensions 60 nm and below; and
(2) contacting the photo mask with a cleaning solution comprising at least one surfactant A as described herein for a time sufficient to remove at least part of the particles deposited onto the photo mask during step (1).

Generally, as much as possible of the particles should be removed by the treatment with the photo mask cleaning solution described herein.

Generally the number of photolithographic cycles may be preselected and fixed or flexible and determined during the process depending on the particle contamination and/or haziness of the photo mask. A typical number of cycles is from about 100 to about 1000.

Generally contacting times of from about 15 s to about 5 min, preferably of from about 30 s to about 240 s are sufficient to remove the particles. Step (2) may be repeated to increase the particle removal.

Preferably, a megasonic treatment is applied in step (2) in order to increase the particle removal and/or to reduce the cleaning time.

Preferably, the cleaning solutions are aqueous solutions. More preferably, the aqueous cleaning solutions contain at least one surfactant A.

"Aqueous" means that the solvent comprises water, preferably deionized water and, most preferably ultrapure water as the main solvent. The aqueous composition may contain water-miscible polar organic solvents, albeit only in such minor amounts that do not jeopardize the aqueous nature of the composition. It is preferred that the solvent essentially consists of water, preferably deionized water and, most preferably ultrapure water. Example of ultrapure water with concentration of 5 ppt (ng/kg), or better, anion concentration 5 ppb (ng/g), or better, total organic content (TOC) 50 ppb (ng/g), or better and contains particles of >0.2 mm under 10000 per ml.

The cleaning solution preferably has a neutral to alkaline pH, preferably in the range of pH 7 to 14, more preferably in the range of 7.5 to 11 and most preferably in the range of 8 to 10, in order to facilitate good particle removal efficiency due the favourable negative zeta potential regime. Such negative zeta potential regime is generally advantageous for removal of small and extremely fine particles below 50 nm size.

As the Opaque MoSi on Glass (OMOG) photo mask substrate surface is easily negatively charged during cleaning process, the alkaline environment lead to negatively charged particles resulting in electrostatic repulsion between the particles and the substrate. This repulsion effect is beneficial for efficient particle removal.

The cleaning solutions preferably do not comprise any ammonia ions ($NH_4^+$) as they are prone to cause CD loss by attacking the photo masks.

It is preferred to use a buffer system providing an alkaline pH regime which do not contain any ammonia ions. Particularly preferred buffer systems are

|   | Buffer solution | Concentration |
|---|---|---|
| A | Tetraalkyl ammonium hydroxide/Glycine Buffer | 0.1 wt %-1 wt % 100 mM to 500 mM |
| B | Triethanolamine/ Hydrochloride Buffer | Triethanol amine hydrochloride (TEA—HCl) 100 mM to 500 mM |
| C | ACES Buffer (zwitterionic buffer) | 2-[(2-Amino-2-oxoethyl)amino]ethanesulfonic acid 100 mM to 500 mM |
| D | HEPES buffer | 2-[4-(2-Hydroxyethyl)-1-piperazine]ethanesulfonic acid 100 mM to 500 mM |
| E | Tris buffer | Tris(hydroxymethyl)aminomethane 100 mM to 500 mM |

According to the present invention, the surfactant A is defined by its static surface tension to be measured in an aqueous solution comprising 1% by weight, preferably 0.1% by weight, more preferably 0.01% by weight and most preferably 0.002% by weight. In such solutions the surfactants A exhibits a static surface tension below 25 mN/m and more preferably below 20 mN/m. The static surface tension can be measured as described, for example, in the American patent application US 2009/0264525 A1, Example 10, "Determination of the Surface Tension", page 30, paragraph [0302] only that the above-mentioned concentrations are used.

The solution of surfactant A in water at the CMC or higher should have a good wetting ability on the target substrate, or preferably total wetting at about 25° C. Preferably the solution containing surfactant A around the CMC or higher should reach a value of the contact angle to the target substrate of less than 35°, after 30 seconds from the initial droplet formation. Preferably, the contact angle of the solution containing surfactant A at the CMC value or above is from 0° to 30°, more preferably from 0° to 20°, most preferably 0° to 10° after 30 seconds or less. The contact angle may be determined according to the method described in the User Manual of the MobileDrop™ Contact Angle Measuring Instrument, KRÜSS GmbH, Hamburg, 2006-2008.

The surfactants A contain at least three, preferably three short-chain perfluorinated groups Rf selected from the group consisting of trifluoromethyl, pentafluoroethyl, 1-heptafluoropropyl, 2-heptafluoropropyl, and pentafluorosulfanyl, preferably pentafluoroethyl and 1-heptafluoropropyl.

Preferably, the perfluorinated groups Rf are bonded to the same multi-valent, preferably four-valent central moiety B.

The central moiety B can be a carbon atom, an alkyl group, preferably having 2-16 carbon atoms, a monocyclic or polycyclic cycloalkyl group, preferably having 5-12 carbon atoms, and mononuclear or polynuclear aryl group, preferably having 6-18 carbon atoms.

The cycloalkyl groups B and the aryl groups B may contain at least one heteroatom selected from the group consisting of oxygen, sulfur, nitrogen and phosphorus. However, it is preferred that such groups B contain only one or no heteroatom so that the hydrophobicity of the central moiety B is not affected.

The alkyl groups and the cycloalkyl groups B may contain at least one multiple bond selected from double bonds and triple bonds. The number of double bonds and/or triple bonds is chosen such that the central moiety B does not become too reactive so that undesired reactions like decomposition, thermally initiated polymerization, polymerization initiated by actinic radiation, reaction with immersion liquids with photoresists and/or other components of the cleaning solutions and the chemical rinse solutions are avoided.

Most preferably, the perfluorinated groups Rf are bonded to the same carbon atom of an alkyl group B.

Suitable alkyl groups B are derived from ethane, propane, isopropane, butane, 2-methyl propane, pentane, isopentane, neopentane, hexane, 2- and 3-methyl hexane, heptane, octane, isooctane, nonane, decane, undecane, dodecane tridecane, tetradecane, pentadecane, and hexadecane.

Most preferably, the perfluorinated groups Rf are bonded to the same ring of the polynuclear cycloalkyl and aryl groups B.

Suitable cycloalkyl groups B are derived from cyclopentane, cyclohexane, cyclopentyl cyclohexane, cyclohexyl cyclohexane, spiro[3.4]octane, spiro[4.4]nonane, spiro[5.4]decane, spirobicyclohexane, norbonane, biyclo[3.2.1]octane, and adamantane.

Suitable aryl groups are derived from benzene, biphenyl, o-, m- and p-terphenyl, naphthalene, anthracene, phenanthrene, and fluoranthene.

The central moiety B most preferably used is a carbon atom and a benzene ring.

In the surfactant A, the perfluorinated groups Rf are bonded to the multi-valent central moiety B via a linker X selected from the group consisting of covalent bonds, silicon atoms, nitrogen atoms, phosphorus atoms, oxygen atoms, sulfur atoms and bivalent organic linking groups L.

Preferably, the bivalent organic linking groups L are selected from the group consisting of short-chain linear alkylene groups, preferably having 1-4 carbon atoms, e.g., methylene, ethylene, trimethylene, and butane1,4-diyl; —C(O)—, —C(S)—, —C(O)—O, —O—C(O)—O—, —O—C(S)—O—, —O—Si(—R)$_2$—, —NR—, —N=N—, —NR—C(O)—, —NR—NR—C(O)—, —NR—NR—C(S)—, —O—C(O)—NR—, —O—C(S)—NR—, —NR—C(O)—NR—, —NR—C(S)—NR—, —S—, —S(O)—, —S(O)$_2$—, —O—S(O)$_2$—, and —NR—S(O)$_2$—.

The bivalent organic linking groups L are chosen such that they do not affect the hydrophobicity of the hydrophobic group D hereinafter described.

Most preferably, the linker X is selected from the group consisting of covalent bonds and nitrogen atoms.

The perfluorinated groups Rf, the linkers X and the central moiety B constitute the hydrophobic group D of the general formula I:

wherein the index n is an integer of at least 3, preferably 3.

Examples for suitable hydrophobic groups D of the general formula I are

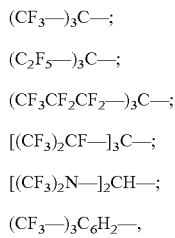

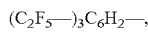

wherein the groups Rf are in the 2,4,6-, 2,3,6-, 2,3,5-, 2,3,4-, or 3,4,5-position;

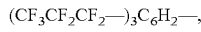

wherein the groups Rf are in the 2,4,6-, 2,3,6-, 2,3,5-, 2,3,4-, or 3,4,5-position;

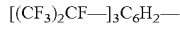

wherein the groups Rf are in the 2,4,6-, 2,3,6-, 2,3,5-, 2,3,4-, or 3,4,5-position;

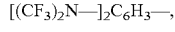

wherein the groups Rf are in the 2,4,6-, 2,3,6-, 2,3,5-, 2,3,4-, or 3,4,5-position;

[(CF$_3$)$_2$N—]$_2$C$_6$H$_3$—, wherein the groups Rf are in the 2,6-, 2,5-, 2,4-, 2,3-, or 3,4-position; or

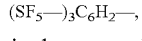

wherein the groups Rf are in the 2,4,6-, 2,3,6-, 2,3,5-, 2,3,4-, or 3,4,5-position.

Most preferably, (CF$_3$—)$_3$C—, (C$_2$F$_5$—)$_3$C—, and (CF$_3$CF$_2$CF$_2$—)$_3$C— and most particularly preferably (CF$_3$CF$_2$CF$_2$—)$_3$C— is or are used as the hydrophobic group D.

In the surfactant A, at least one, preferably one hydrophobic group D is bonded to at least one hydrophilic group E.

The hydrophilic group E is selected from the group consisting of anionic groups, cationic groups and nonionic groups.

Preferably, the anionic groups E are selected from the group consisting of carboxylic acid groups, sulfonic acid groups, sulfuric acid groups, phosphonic acid groups, phosphoric acid groups, carboxylate groups, sulfonate groups, substituted sulfonimide and sulfonamide groups, sulfate groups, phosphonate groups, and phosphate groups, preferably sulfonate groups and negatively charged substituted sulfonimide and sulfonamide groups. Preferably, the counterions are selected from the group consisting of ammonium, primary ammonium, secondary ammonium, tertiary ammonium and quaternary ammonium groups and lithium, sodium and potassium cations, in particular sodium cations.

Preferably, the cationic groups E are selected from the group consisting of primary, secondary, tertiary and quaternary ammonium groups, quaternary phosphonium groups and tertiary sulfonium groups. Preferably, the counterions are selected from anions derived from volatile organic and inorganic acids, preferably formic acid, acetic acid and HCl.

When the hydrophilic group E consists only of the anionic or cationic groups E the said groups are directly bonded to the central moiety B described above, i.e., the linker Y is a covalent bond.

Preferably, the nonionic groups E are selected from the group consisting of hydroxy groups, groups having at least one hydroxy group and cyclic, linear and branched ether groups.

When the hydrophilic group E consists only of the hydroxy group the said group is directly bonded to the central moiety B described above, i.e, the linker Y is a covalent bond.

More preferably, the groups E having at least one hydroxy group are derived from polyhydroxy compounds selected from the group consisting, ethylene glycol, propylene glycol, diethylene glycol, triethylene glycol, dipropylene glycol, tripropylene glycol, ethylene propylene glycol, diethylene propylene glycol, ethylene dipropylene glycol, glycerol, 1,2,3-trihydroxy-n-butane, trimethylolpropane, erythritol, threitol pentaerythritol, di-, tri-, tetra-, penta-, hexa-, hepta-, octa-, nona-, deca-, undeca- and dodecaglycerol, -trimethylolpropane, -erythritol, -threitol and -pentaerythritol; arabinitol, ribitol and xylitol, galactitol, mannitol, glucitol, allitol, altritol, maltitol, isomalt, lactitol, iditol, 1,2,3,4-tetrahydroxycyclohexane, 1,2,3,4,5-pentahydroxycyclohexane, myo-, scyllo-, muco-, chiro-, neo-, allo-, epi- and cis-inositol, allose, altrose, glucose, mannose, idose, galactose and talose, sorbitan, and 1,5- and 1,4-sorbitan esters. Additional suitable hydroxy compounds are described in the American patent application US 2009/0264525 A1, page 2, paragraphs [0019] to [0026].

More preferably, the cyclic ether groups E are derived from cyclic ethers selected from the group consisting of tetrahydrofurane, tetrahydropyrane, and 1,4-dioxane.

More preferably, the linear and branched ether groups E are derived from polyethers selected from the group consisting of diethylene glycol, triethylene glycol, dipropylene glycol, tripropylene glycol, polyethyleneoxide preferably having a degree of polymerization of 4-100, and ethoxylated polyhydroxy compounds, in particular the polyhydroxy compounds described above.

The hydrophilic groups E may be combined in any suitable manner. Thus, the hydrophilic groups E may contain anionic and cationic groups so that amphoteric or zwitterionic hydrophilic groups E result of. Likewise, the nonionic groups E may be combined with any one of the cationic and/or the anionic groups E.

In the surfactant A, the hydrophobic group D is bonded to the hydrophilic group E via a linker Y, thus constituting the surfactant A of the general formula II:

$$(DY\text{-})_m E \qquad (II),$$

wherein the index m is an integer of at least 1.

The linker Y is selected from the group consisting of covalent bonds, silicon atoms, nitrogen atoms, phosphorus atoms, oxygen atoms, sulfur atoms and the above described bivalent linking groups L.

Suitable surfactants A which can be used in accordance with the use of the invention and methods for their preparation are described, for example, in the international patent applications WO 2008/003443 A1, page 3, line 1 to page 14, line 12 in conjunction with page 90, line 11 to page 144, line 28;

WO 2008/003445 A1, page 3, line 20 to page 40, line 11 in conjunction with page 49, line 1 to page 62, line 28;

WO 2008/003446 A1, page 3, line 21 to page 14, line 28 in conjunction with page 22, line 11 to page 88, line 2; and WO 2009/14980 A1, page 3, line 4 to page 5, line 13 in conjunction with page 6, line 26, to page 13, line 9;

and in the American patent application

US 2009/0264525 A1, page 1, paragraph [0001], page 1, paragraph [0012] to page 20, [0171] in conjunction with page 22, paragraph [0206] to page 30, paragraph [0303].

Most preferably, tris(pentafluoroethyl)methane sulfonic acid sodium salt and homologues of tris(pentafluoroethyl)methane sulfonic acid sodium salt having a molecular weight of up to 2000 Dalton, preferably 1500 Dalton, more preferably 1250, and most preferably 900 Dalton, wherein the sulfonate group is linked with the tris(pentafluoroethyl)methyl group via a bivalent polyoxyethylene group;

tris(pentafluoroethyl)benzene sulfonic acid sodium salt and homologues of tris(pentafluoroethyl)benzene sulfonic acid sodium salt having a molecular weight of up to 2000 Dalton, preferably 1500 Dalton, more preferably 1250, and most preferably 1000 Dalton, wherein the sulfonate group is linked with the tris(pentafluoroethyl)phenyl group via a bivalent polyoxyethylene group;

tris(heptafluoroprop-1-yl)methane sulfonic acid sodium salt and homologues of tris(heptafluoroprop-1-yl)methane sulfonic acid sodium salt having a molecular weight of up to 2000 Dalton, preferably 1500 Dalton, more preferably 1250, and most preferably 1000 Dalton, wherein the sulfonate group is linked with the tris(heptafluoroprop-1-yl)methyl group via a bivalent polyoxyethylene group; and tris(heptafluoroprop-1-yl)benzene sulfonic acid sodium salt and homologues of tris(heptafluoroprop-1-yl)benzene sulfonic acid sodium salt having a molecular weight of up to 2000 Dalton, preferably 1500 Dalton, more preferably 1250, and most preferably 1000 Dalton, wherein the sulfonate group is linked with the tris(heptafluoroprop-1-yl)phenyl group via a bivalent polyoxyethylene group are used as surfactants A.

The surfactants A are particularly useful for cleaning of any type of photo masks having particularly small patters, either during its preparation or during its use in the IC manufacture.

Customary and known equipment customarily used in the semiconductor industry can be used for carrying out the process of the invention.

All percent, ppm or comparable values refer to the weight with respect to the total weight of the respective composition except where otherwise indicated. The documents cited in the present application are incorporated herein by reference in their entirety.

Example 1

A photo mask cleaner was prepared by solving 0.05% by weight of tris(pentafluoroethyl)methane sulfonic acid sodium salt in electronic grade ultra pure water.

The photo mask cleaner showed a static surface tension of 20.7 mN/m and a critical micellization concentration (CMC) of 0.1% by weight. The surfactant A caused very fast reduction of the surface tension in the dynamic surface tension test in a bubble tensiometer at concentrations of 0.1% by weight.

Photo mask blankets were patterned by eBeam writing after being coated with a photoresist. The EUV mask contained patterns with smallest line-dimensions of about 60 nm wide, which corresponds to patterns of line-dimensions of 15 nm (half pitch) on the wafer (i.e. the 4× magnification system) of the semiconductor substrate. Thereafter, the exposed photoresist layers were baked, developed and removed according to state of the art materials and procedures. After this step the photo mask was rinsed with the photo mask cleaner solution supported by megasonic treatment in order to enhance particle removal efficiency. The chemical rinse solutions were applied as puddles followed by megasonic treatment. Thereafter, the photo masks were spun dry. The dried photomasks did not show any watermarks, haze defects or CD loss due to etching.

The use of alkaline mask cleaner solution containing homologues of tris(pentafluoroethyl)methane sulfonic acid and its salts and tris(heptafluoroprop-1-yl)methane sulfonic acid and its salts and ammonia free buffer showed following cleaning performance.

Comparative Example 1

A photo mask cleaner and a photo resist was prepared as described in example 1 except that electronic grade ultra pure water was used as photo mask cleaner.

The mask cleaner of example 1 showed the following advantages over the cleaning with ultra pure water:

The mask cleaner solution of example 1 offered a 5% higher particle removal efficiency compared to the mask cleaning process using ultra pure water. As the cleaning process is accelerated by physical forces the process window for megasonic treatment is increased by at least 40 to 50%. Means that at high power of mega sonic treatment the pattern damage could be significantly be reduced. This further increases the cleaning efficiency.

In summary, the homologues of tris(heptafluoroprop-1-yl)methane sulfonic acid sodium salt and tris(pentafluoroethyl)methane sulfonic acid sodium salt were excellently suited for use in photo mask cleaning solutions.

The following test methods were applied

Particle Removal Efficiency:

Standard procedure was followed to measure the particle removal efficiency. The particle counts before treatment were measured on standard defectivity tools used in the semiconductor processing. After treatment with mask cleaner solution the particle counts were measured again in order to calculate the particle removal efficiency by the general formula:

(POST counts/PRE counts)*100%=Removal efficiency

Zeta Potential Measurement:

As the OMOG photo mask substrate surface is easily negatively charged during cleaning process, the alkaline environment lead to negatively charged particles, resulting in electrostatic repulsion between the particles and the substrate. This repulsion effect is beneficial for efficient particle removal.

The zeta potential of small silicon oxide (SiO) and silicon nitride (SiN) particles with a particle size of 50-200 nm was measured in the mask cleaner solution. Mask cleaner solutions offer negative zeta potential for the SiN and SiO particles in the range of −65 mV to −96 mV. These values are beneficial for good particle removal efficiency in the mask cleaning application.

Static Surface Tension:

The static surface tension was measured measured as described in the American patent application US 2009/0264525 A1, Example 10, Determination of the Surface Tension, page 30, paragraph [0302].

Dynamic Surface Tension:

Both surfactants A caused very fast reduction of the surface tension in the dynamic surface tension test in a bubble tensiometer at concentrations of 0.1% by weight.

Contact Angle:

The contact angle is determined according to the method described in the User Manual of the MobileDrop™ Contact Angle Measuring Instrument, KRÜSS GmbH, Hamburg, 2006-2008.

The invention claimed is:

1. A method for cleaning photo masks comprising patterns with smallest line-space dimensions below 200 nm, the method comprising:
providing a substrate having a transmission-type or reflective-type photo mask that comprises at least one molybdenum (Mo) layer and at least one silicon (Si) layer, and
contacting said substrate with a cleaning solution;
wherein said cleaning solution comprises a surfactant composition A, wherein surfactant composition A comprises at least three short-chain perfluorinated groups Rf selected from the group consisting of trifluoromethyl, pentafluoroethyl, 1-heptafluoropropyl, 2-heptafluoropropyl, and pentafluorosulfanyl and wherein A exhibits, at a 1% by weight aqueous solution, a static surface tension below 25 mN/m.

2. The method according to claim 1, wherein the perfluorinated groups Rf are bonded to the same multi-valent central moiety, B.

3. The method according to claim 2, wherein the perfluorinated groups Rf in the surfactant A are bonded to the multi-valent central moiety B via a linker X selected from the group consisting of covalent bonds, silicon atoms, nitrogen atoms, phosphorus atoms, oxygen atoms, sulfur atoms and bivalent organic linking groups L; wherein Rf, B and X constitute a hydrophobic group D of the general formula I:

(RfX—)$_n$B—     (I), wherein the index n is an integer of at least 3.

4. The method according to claim 1, wherein the surfactant composition A contains at least one hydrophobic group D.

5. The method according to claim 4, wherein the at least one hydrophobic group D is bonded to at least one hydrophilic group E selected from the group consisting of anionic groups, cationic groups and nonionic groups via a linker Y selected from the group consisting of covalent bonds, silicon atoms, nitrogen atoms, phosphorus atoms, oxygen atoms, sulfur atoms and bivalent organic linking groups L; wherein D, Y and E constitute the surfactant A of the general formula II:

(DY-)$_m$E     (II), wherein the index m is an integer of at least 1.

6. The method according to claim 1, wherein the photo masks have patterned material layers for manufacturing semiconductor substrates comprising patterns with smallest line-space dimensions below 30 nm.

7. The method according to claim 1, wherein the transmission-type photo mask is a molybdenum (Mo) silicon (Si) on glass (OMOG) mask for use in 193 nm ArF lithography.

8. The method according to claim 1, wherein the reflective-type photo mask is a photo mask comprising multiple alternating layers of molybdenum (Mo), and silicon (Si), and optionally ruthenium (Ru) and absorber layer for use in 13.5 nm EUV lithography.

9. The method according to claim 1, wherein surfactant composition A is used as an aqueous solution, said aqueous solution having a contact angle to the photo mask substrate of less than 35° after 30 seconds from the initial droplet formation.

10. The method according to claim 1, wherein the photo masks are used for manufacturing semiconductor substrates comprising patterns with smallest line-space dimensions below 60 nm.

11. A photo mask preparation process, the process comprising the steps of
providing a photo mask carrier,
depositing at least one of absorbing and reflective layer(s) comprising molybdenum and silicon on the carrier thereby forming either a transmission-type or reflective-type photo mask,
structuring at least one of the absorbing and non-reflecting layer to obtain a photo mask comprising patterns having smallest line-space dimensions of 200 nm and below,
cleaning the photo mask with a solution comprising at least one surfactant A, a 1% by weight aqueous solution of which exhibiting a static surface tension below 25 mN/m, the said surfactant A containing at least three short-chain perfluorinated groups Rf selected from the group consisting of trifluoromethyl, pentafluoroethyl, 1-heptafluoropropyl, 2-heptafluoropropyl, and pentafluorosulfanyl groups is performed.

12. The photo mask preparation process according to claim 11, characterized in that the perfluorinated groups Rf in the surfactant A are bonded to the same multi-valent central moiety B.

13. The photo mask preparation process according to claim 12, characterized in that the perfluorinated groups Rf in the surfactant A are bonded to the multi-valent central moiety B via a linker X selected from the group consisting of covalent bonds, silicon atoms, nitrogen atoms, phosphorus atoms, oxygen atoms, sulfur atoms and bivalent organic linking groups L; wherein Rf, B and X constitute a hydrophobic group D of the general formula I:

(RfX—)$_n$B—            (I), wherein the index n is an integer of at least 3.

14. The photo mask preparation process according to claim 11, characterized in that the surfactant A contains at least one hydrophobic group D.

15. The photo mask preparation process according to claim 11, characterized in that the at least one hydrophobic group D is bonded to at least one hydrophilic group E selected from the group consisting of anionic groups, cationic groups and nonionic groups; via a linker Y selected from the group consisting of covalent bonds, silicon atoms, nitrogen atoms, phosphorus atoms, oxygen atoms, sulfur atoms or bivalent organic linking groups L; wherein D, Y and E constitute the surfactant A of the general formula II:

(DY-)$_m$E            (II), wherein the index m is an integer of at least 1.

16. The photo mask preparation process according to claim 11 further comprising depositing an absorbing layer on the reflective layer(s).

17. A photolithographic process, the process comprising the steps of
providing a substrate having a photoresist layer;
exposing the photoresist layer to actinic radiation by using a transmission-type or reflective-type photo mask;
developing the exposed photoresist layer with a developer solution in order to receive patterns having line-space dimensions of 60 nm and below; and
contacting the photo mask with a cleaning solution comprising at least one surfactant A, a 1% by weight aqueous solution of which exhibits a static surface tension below 25 mN/m, the said surfactant A containing at least three short-chain perfluorinated groups Rf selected from the group consisting of trifluoromethyl, pentafluoroethyl, 1-heptafluoropropyl, 2-heptafluoropropyl, and pentafluorosulfanyl groups for a time sufficient to remove at least part of the particles deposited onto the photo mask during step (1).

18. A photolithographic process according to claim 17, wherein a megasonic treatment is applied in step (2).

* * * * *